(12) United States Patent
Lee et al.

(10) Patent No.: US 10,483,351 B2
(45) Date of Patent: Nov. 19, 2019

(54) METHOD OF MANUFACTURING A SUBSTRATE WITH REDUCED THREADING DISLOCATION DENSITY

(71) Applicants: Nanyang Technological University, Singapore (SG); Massachusetts Institute of Technology, Cambridge, MA (US)

(72) Inventors: Kwang Hong Lee, Singapore (SG); Chuan Seng Tan, Singapore (SG); Eugene A. Fitzgerald, Cambridge, MA (US); Shuyu Bao, Singapore (SG)

(73) Assignees: Nanyang Technological University (SG); Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/757,057

(22) PCT Filed: Sep. 2, 2016

(86) PCT No.: PCT/SG2016/050431
§ 371 (c)(1),
(2) Date: Mar. 2, 2018

(87) PCT Pub. No.: WO2017/039547
PCT Pub. Date: Mar. 9, 2017

(65) Prior Publication Data
US 2018/0277629 A1     Sep. 27, 2018

Related U.S. Application Data

(60) Provisional application No. 62/283,652, filed on Sep. 4, 2015.

(51) Int. Cl.
*H01L 29/06* (2006.01)
*H01L 21/02* (2006.01)
(Continued)

(52) U.S. Cl.
CPC .......... *H01L 29/0684* (2013.01); *C30B 25/10* (2013.01); *C30B 29/08* (2013.01);
(Continued)

(58) Field of Classification Search
CPC ........... H01L 29/0684; H01L 21/02381; H01L 21/02433; H01L 21/02532; H01L 21/02576
See application file for complete search history.

(56) References Cited

U.S. PATENT DOCUMENTS 6,635,110 B1    10/2003   Luan et al.
2002/0074552 A1*  6/2002  Weeks, Jr. .............. C30B 23/02
                                                            257/76
(Continued)

FOREIGN PATENT DOCUMENTS

WO      2014104973 A1     7/2014

OTHER PUBLICATIONS

International Search Report for PCT/SG2016/050431 dated Dec. 22, 2016.
(Continued)

*Primary Examiner* — Nathan W Ha
(74) *Attorney, Agent, or Firm* — Lerner, David, Littenberg, Krumholz & Mentlik, LLP

(57) ABSTRACT

A method of manufacturing a substrate with reduced threading dislocation density is disclosed, which comprises: (i) at a first temperature, forming a first layer of wafer material on a semiconductor substrate, the first layer arranged to be doped with a first concentration of at least one dopant that is different to the wafer material; and (ii) at a second temperature higher than the first temperature, forming a second layer of the wafer material on the first layer to obtain the substrate, the second layer arranged to be doped with a progressively decreasing concentration of the dopant during (Continued)

formation, the doping configured to be decreased from the first concentration to a second concentration. The wafer material and dopant are different to silicon. A related substrate is also disclosed.

8 Claims, 10 Drawing Sheets

(51) Int. Cl.
  *C30B 25/10*   (2006.01)
  *C30B 29/08*   (2006.01)
  *H01L 21/324*   (2006.01)
  *H01L 33/00*   (2010.01)

(52) U.S. Cl.
  CPC ...... *H01L 21/0245* (2013.01); *H01L 21/0262* (2013.01); *H01L 21/02381* (2013.01); *H01L 21/02433* (2013.01); *H01L 21/02532* (2013.01); *H01L 21/02576* (2013.01); *H01L 21/3247* (2013.01); *H01L 33/007* (2013.01)

(56) References Cited

U.S. PATENT DOCUMENTS

| | | |
|---|---|---|
| 2002/0190259 A1 | 12/2002 | Goetz et al. |
| 2004/0065363 A1* | 4/2004 | Fetzer ............... H01L 21/02381 136/262 |
| 2010/0133585 A1 | 6/2010 | Kim et al. |
| 2010/0176371 A1* | 7/2010 | Lochtefeld ........ H01L 21/02381 257/13 |
| 2013/0065342 A1* | 3/2013 | Stauss ............... H01L 21/02381 438/46 |
| 2013/0214281 A1* | 8/2013 | Li ..................... H01L 21/02381 257/76 |
| 2014/0097433 A1* | 4/2014 | Negoro ............. H01L 29/66462 257/51 |
| 2014/0209862 A1 | 7/2014 | Ikuta et al. |
| 2015/0280058 A1* | 10/2015 | Kappers ........... H01L 21/02381 257/13 |
| 2015/0287791 A1* | 10/2015 | Kohda ............. H01L 21/02381 257/76 |

OTHER PUBLICATIONS

Luan, Hsin-Chiao et al., "High-quality epilayers on Si with low threading-dislocation densities", Applied Physics Letters, vol. 75, No. 19, Nov. 8, 1999, pp. 2909-2911.

Song, Yuxin et al., "Effects of doping and grading slope on surface and structure of metamorphic InGaAs buffers on GaAs substrates", Journal of Applied Physics, vol. 106, 123531 (2009), pp. 1-7.

\* cited by examiner

METHOD OF MANUFACTURING A SUBSTRATE WITH REDUCED THREADING DISLOCATION DENSITY

CROSS REFERENCE TO RELATED APPLICATIONS

The present application is a national phase entry under 35 U.S.C. § 371 of International Application No. PCT/SG2016/050431 filed Sep. 2, 2016, published in English, which claims priority from U.S. Application Ser. No. 62/283,652 filed Sep. 4, 2015, all of which are incorporated herein by reference.

FIELD

The present invention relates to a method of manufacturing a substrate with reduced threading dislocation density.

BACKGROUND

For the past few decades, rigorous scaling methods have been driving the silicon (Si) complementary metal-oxide-semiconductor (CMOS) technology to enhance device performance, lower the power consumption and reduce cost per transistor. As the device dimension approaches the scaling limit, a paradigm shift has been actively explored in the semiconductor industry from dimensional scaling alone to materials innovation (i.e. "performance boosters"). One example is the integration of III-V compound materials, which have the necessary unique properties suitable for producing devices configured for future high speed and low power computation applications. Most III-V materials show 20-70 times higher electron mobility and approximately 20 times higher conductivity than those properties of Si. In addition, the feasibility of energy bandgap engineering of III-V materials enables fabrication of devices suitable for communications and optoelectronics. However, III-V materials per se cannot fully replace Si, because III-V substrates are very costly to manufacture, and also smaller in size due to their brittle mechanical properties (i.e. usually 200 mm). Therefore, small quantity of III-V materials has to be selectively integrated onto Si substrates to be compatible with existing mainstream CMOS manufacturing technologies. So to realize III-V materials integration on low cost and mechanically strong Si substrates, a number of research groups have been investigating III-V growth on Si substrates for optoelectronics and microelectronics applications.

In this respect, growing germanium (Ge) epitaxial layer on a Si substrate has attracted great attention among researchers, because of the potential applications in photonic and electronics devices. Perhaps most importantly, Ge is a group IV material, which is compatible with Si and thus may be processed in standard silicon manufacturing facilities. Another important application is that the Ge-on-Si substrate (Ge/Si) may also be used as a template for subsequent III-V compounds growth, since Ge is lattice-matched with gallium arsenide (GaAs). The desired Ge epitaxial film must have low defect density, in terms of threading dislocation density (TDD), and smooth surface with thin buffer layers.

One main challenge to produce high quality III-V materials on Si suitable for manufacturing compatibility with present CMOS technologies relates to the issue of significant lattice mismatch between the two materials (e.g. the mismatch is about 4.1% in the case of GaAs). To resolve the issue, Ge, which has a lattice constant that is perfectly matched to GaAs (i.e. 0.07% at 300 K) and has superior electron and hole mobility compared to Si, can first be grown on Si to provide a buffer layer for integration and fabrication of GaAs-based devices on Si substrate. Another possible solution is to form a germanium-on-insulator (GOI) substrate for the same application described above. Besides acting as a "passive" buffer layer, Ge on Si, or GOI substrates (with no III-V layers) may further have potential applications in advanced CMOS circuit and photonics.

But it is also to be appreciated that the challenge in growing Ge on Si falls on the approximately 4% lattice mismatch between Si and Ge, which may result in a high defect density with rough surface. A known method to address this problem is to grow a SiGe graded buffer with variable composition, and smoothen the surface of the graded buffer via chemical mechanical polishing (CMP) at a composition of $Si_{0.5}Ge_{0.5}$. Through this method, a TDD of about $10^5/cm^2$ can be achieved, but it however requires a 10 μm thick graded SiGe buffer layer. Such thickness is practically obtainable using typical high-temperature chemical vapour deposition (CVD) processes resulting in μm/min growth rates. However, sometimes it may be desirable to have thinner initial layers for some applications, e.g. laser, photovoltaic, and etc.

A two-step growth approach using various types of CVD tools is another known approach. This approach includes a low temperature (i.e. 330-400° C.) growth step that is followed by a high temperature (i.e. 600-850° C.) Ge growth. The TDD is then greatly reduced by carrying out post-growth annealing or thermal cyclic annealing. Unfortunately, this method still results in the Ge/Si having a much higher TDD of greater than $10^7/cm^2$. Undesirably, the high TDD level is anticipated to degrade any subsequent III-V materials integration, and may also consequently lead to device failure later on in usage.

Another approach to reduce the TDD is through annealing the GOI substrate which is fabricated through bonding and layer transferring a Ge epilayer that is grown using the two-step approach. Using this method, an etch-pit density (EPD) of lesser than $10^6/cm^2$ may be obtained.

One object of the present invention is therefore to address at least one of the problems of the prior art and/or to provide a choice that is useful in the art.

SUMMARY

According to a $1^{st}$ aspect, there is provided a method of manufacturing a substrate with reduced threading dislocation density, comprising: (i) at a first temperature, forming a first layer of wafer material on a semiconductor substrate, the first layer arranged to be doped with a first concentration of at least one dopant that is different to the wafer material; and (ii) at a second temperature higher than the first temperature, forming a second layer of the wafer material on the first layer to obtain the substrate, the second layer arranged to be doped with a progressively decreasing concentration of the dopant during formation, the doping configured to be decreased from the first concentration to a second concentration, wherein the wafer material and dopant are different to silicon.

Advantageously, the proposed method enables manufacturing the substrate with a reduced threading dislocation density of about $4.5 \times 10^6$ $cm^{-2}$ which is significantly lower than what most conventional techniques can offer. Moreover, the disclosed method is also scalable to manufacture any wafer size, thus rendering the method manufacturing worthy.

Preferably, the dopant may include a group V semiconductor material, like arsenic, or phosphorus.

Further, the wafer material may preferably include germanium.

Also, the semiconductor substrate may be a silicon substrate with 6° off-cut toward [110] direction.

Preferably, the first temperature may approximately be between 300° C. to 450° C., whereas the second temperature may be approximately between 550° C. to 700° C.

Preferably, the first concentration may be between approximately $8 \times 10^{18}/cm^3$ to $1 \times 10^{20}/cm^3$.

Preferably, the doping may be performed using $AsH_3$, if the group V semiconductor material is arsenic.

Moreover, the method, wherein subsequent to step (ii), may further optionally include thermal cyclic annealing the substrate to enhance surface mobility of atoms of the dopant doped into the first and second layers.

Specifically, the annealing may be performed using a gas selected from the group consisting of oxygen, hydrogen, nitrogen, forming gas, and argon.

Preferably, the annealing is performable using hydrogen at a temperature between about 25° C. to 940° C.

Preferably, wherein at steps (i), and (ii), forming the first, and second layers of wafer material may include depositing the first, and second layers of wafer material using a metal-organic chemical vapour deposition reactor.

According to a $2^{nd}$ aspect, there is provided a substrate with reduced threading dislocation density, comprising: a semiconductor substrate; a first layer of wafer material formed on the semiconductor substrate, the first layer being doped with a first concentration of at least one dopant that is different to the wafer material; and a second layer of the wafer material formed on the first layer, the second layer being doped with a progressively decreasing concentration of the dopant, the doping configured to be decreased from the first concentration to a second concentration. The wafer material and dopant are different to silicon.

Preferably, the first and second layers may collectively be configured with a thickness of about 1.5 μm, and may have an etch-pit density of less than $5 \times 10^6/cm^2$.

Preferably, the substrate may have an RMS surface roughness of less than 0.50 nm.

Preferably, the dopant may include a group V semiconductor material, such as (for example) arsenic, or phosphorus.

Preferably, the wafer material may include germanium.

Preferably, the semiconductor substrate may be a silicon substrate with 6° off-cut toward [110] direction.

Preferably, the first concentration may approximately be between $8 \times 10^{18}/cm^3$ to $1 \times 10^{20}/cm^3$.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which.

DETAILED DESCRIPTION OF PREFERRED EMBODIMENTS

1. Experimental Details

Figure 1:
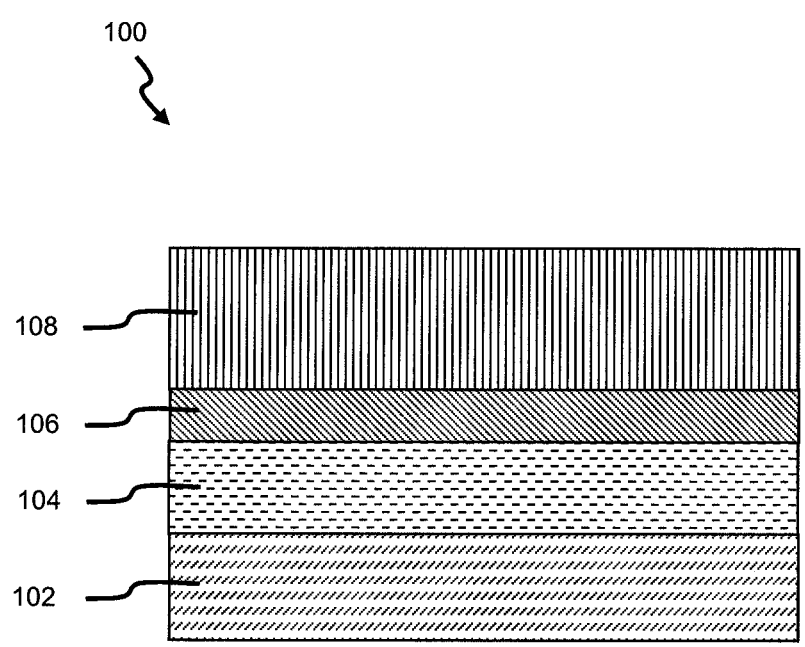
FIG. 1 is a schematic cross-sectional view of a substrate with reduced threading dislocation density, according to an embodiment.

FIG. 1 shows a schematic cross-sectional view of a proposed substrate 100 with reduced threading dislocation density (TDD), according to an exemplary embodiment. The substrate 100 comprises a semiconductor substrate 102; a first layer 104 of wafer material formed on the semiconductor substrate 102, the first layer 104 being doped with a first concentration of at least one dopant (which is different to the wafer material of the first layer 104); a second layer 106 of the wafer material formed on the first layer 104, the second layer 106 being doped with a progressively decreasing concentration of the dopant, in which the doping is progressively decreased from the first concentration to a second concentration; and a third layer 108 of the wafer material formed on the second layer 106. The wafer material and dopant are different to silicon. So from a top-down perspective, the substrate 100 is arranged with this layering sequence: the third layer 108, the second layer 106, the first layer 104, and the semiconductor substrate 102 (lying at the bottom of the substrate 100). For good order, it is highlighted that the relative dimensions of the semiconductor substrate 102, and the first, second and third layers 104, 106, 108 shown in FIG. 1 have been exaggerated simply for clarity of illustration, and are not to be construed as representative of the actual dimensions.

Figure 2:
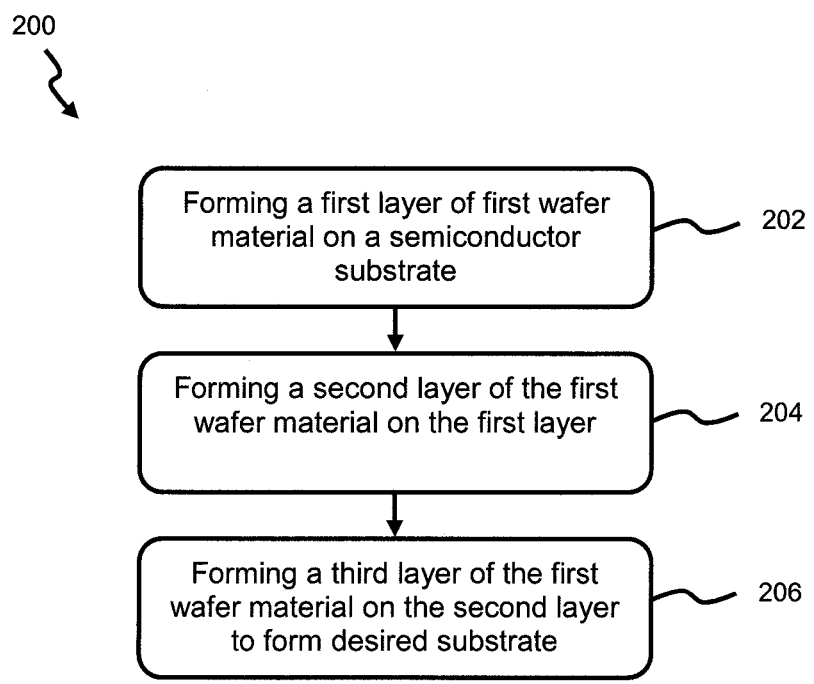
FIG. 2 is a disclosed method of manufacturing the substrate of FIG. 1.

FIG. 2 then depicts a corresponding method 200 of manufacturing the substrate 100 of FIG. 1. Broadly, the method 200 includes: at a first temperature, forming the first layer 104 of the wafer material on the semiconductor substrate 102 (at step 202), the first layer 104 arranged to be doped with a first concentration of the at least one dopant; at a second temperature higher than the first temperature, forming the second layer 106 of the wafer material on the first layer 104 (at step 204), the second layer 106 arranged to be doped with a progressively decreasing concentration of the dopant during formation (of the second layer 106), the doping configured to be decreased from the first concentration to a second concentration; and at the second temperature, forming the third layer 108 of the wafer material on the second layer 106 (at step 206) to obtain the substrate 100, wherein the third layer 108 is formed in the absence of doping (i.e. pure growth of the third layer 108 without any dopants added). Further, to clarify, the second concentration is lower than the first concentration (as will be apparent from the details of step 204), and is also intended to be significantly lower as well. Moreover, it is to be appreciated that a value of second concentration selected for use depends on the type of devices (e.g. light emitting diodes) desired to be grown on the third layer 108, and is thus flexible based on intended applications for the substrate 100.

In this instance, the semiconductor substrate 102 is a silicon substrate with 6° off-cut towards the [110] direction (but however is not to be construed as limiting—other directions (e.g. [-110]) and different suitable degrees of off-cut (e.g. about 2° to about 10° may also be possible), which is chosen for being usable in subsequent III-V compound semiconductor materials growth, in order to eliminate formation of anti-phase domains. Then, germanium (Ge) is selected to be used as the wafer material, while arsenic (As) is selected as the dopant, but other suitable group V semiconductor materials, such as phosphorus (P) or antimony (Sb), may also be used instead as the dopant, if desired. Moreover, it is highlighted that other suitable dopants not belonging to group V semiconductor materials may alternatively be used too, as will be understood by persons skilled in the art. Accordingly, to illustrate the method 200 in greater detail, an example based on the above specific selected materials is described below.

First, silicon (001) wafers (i.e. diameter=200 mm, p-type, resistivity=1-100 Ω-cm) with 6° off-cut toward [110] direction are cleaned using standard RCA solutions followed by dipping the cleaned wafers into a diluted HF solution (i.e. HF:H$_2$O=1:10 by volume). The cleaned wafers are then loaded into the N$_2$-purged load-lock of an Aixtron Crius metal-organic chemical vapour deposition (MOCVD) reactor in preparation for (different layers of) Ge growth. It is to be appreciated that molecular beam epitaxy (MBE) and other suitable methods may also be used in alternative of MOCVD.

To initiate Ge growth, the cleaned wafers are transferred to a growth chamber and baked in hydrogen (H$_2$) at 1050° C. for about 10 minutes to desorb a thin surface oxide layer that can be detrimental to the epitaxy process. After that, a thin Si layer is grown to condition the Si surface (of the wafers) and to bury any surface contamination in order to provide a high quality surface for Ge growth later. Subsequently, a three-step Ge growth process (corresponding to the proposed method 200 of FIG. 2) is introduced to grow the Ge epilayer directly on a Si wafer (i.e. the semiconductor substrate 102).

Figure 9:
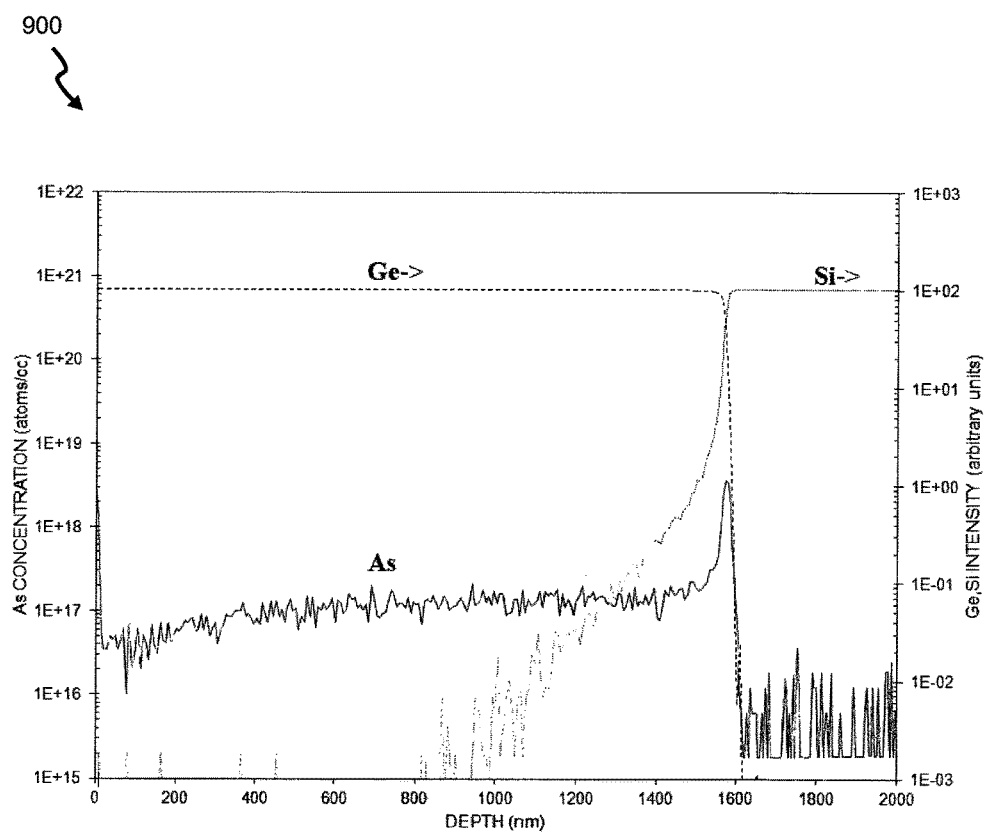
FIG. 9 is a graph depicting experimental results of first and second concentrations of the dopant used for doping first and second layers of the substrate of FIG. 1, based on the method of FIG. 2.

More specifically, the three steps in the growth process are: (i) performing low temperature Ge growth at a temperature between 300° C. to 450° C. (i.e. the first temperature) on the Si wafer, coupled with heavy As-doping, to obtain a relatively smooth and continuous Ge seed layer (i.e. the first layer 104), in which the As-doping is performed using a flow of AsH$_3$ switched on at maximum level (i.e. concentration of the As dopants is about $10^{19}$/cm$^3$ being the first concentration referred to at step 202); (ii) performing high temperature Ge growth at a temperature between 550° C. to 700° C. (i.e. the second temperature) to form a graded GeAs layer (i.e. the second layer 106) on the Ge seed layer, by gradually reducing the flow of AsH$_3$ from maximum flow to zero flow (i.e. being the second concentration referred to at step 204); and (iii) performing high temperature pure Ge growth at 650° C. (i.e. the second temperature) to form a Ge epilayer (i.e. the third layer 108) on the graded GeAs layer to obtain a Ge epitaxial film (i.e. the substrate 100), with the intended thickness at a reasonable growth rate. For step (ii), it is to be appreciated that the doping may be reduced (for example) by one order of magnitude per 100 nm of Ge. FIG. 9 is a graph 900 depicting example experimental results of first and second concentrations of As used for doping the Ge seed layer and GeAs layer. Accordingly, the steps (i), (ii), and (iii) respectively correspond to steps 202, 204, and 206 of method 200. Then, the Ge seed layer, graded GeAs layer, and Ge epilayer may (for example) respectively be about 400 nm, 300 nm, and 700 nm thick, or alternatively, 100 nm, 200 nm, and 800 nm thick. Needless to say, the respectively thicknesses of the Ge seed layer, graded GeAs layer, and Ge epilayer to be formed depend on requirements of intended applications.

Optionally, thermal cyclic annealing may be introduced immediately after step (iii) to enhance the surface mobility of the Ge atoms in order to control the surface roughness and to reduce the TDD eventually obtained. Thermal cyclic annealing is performed by hydrogen (H$_2$) annealing the Ge epitaxial film at a temperature between about 650° C. to 850° C., being repeated 5 times. More specifically, this means: (i) annealing at 850° C., and holding for 10 minutes, (ii) then annealing at 650° C., and holding for 5 minutes, and (iii) repeating steps (i) and (ii) for five times. The annealing may also be carried out using other suitable gases such as oxygen (O$_2$), nitrogen (N$_2$), forming gas, or argon (Ar). For comparative purposes, a control sample is also grown, i.e. a Ge/Si substrate is grown under the same conditions, but without including As-doping (at steps 202, and 204).

The properties of the Ge epitaxial film are subsequently characterized using various investigative techniques, and the results are discussed in the next section below. A transmission electron microscopy (e.g. TEM; Philips CM200) with an operating voltage of 200 kV is used to study the dislocations along the Ge/Si interface as well as the threading dislocations on the Ge surface. On the other hand, the strain and quality of the Ge film formed are measured by high resolution x-ray diffraction (HRXRD) using the PANalytical™ X'Pert PRO diffraction system. Rocking curves based on Si (004) are collected in the HRXRD measurements.

2. Results and Discussions

Figure 3:
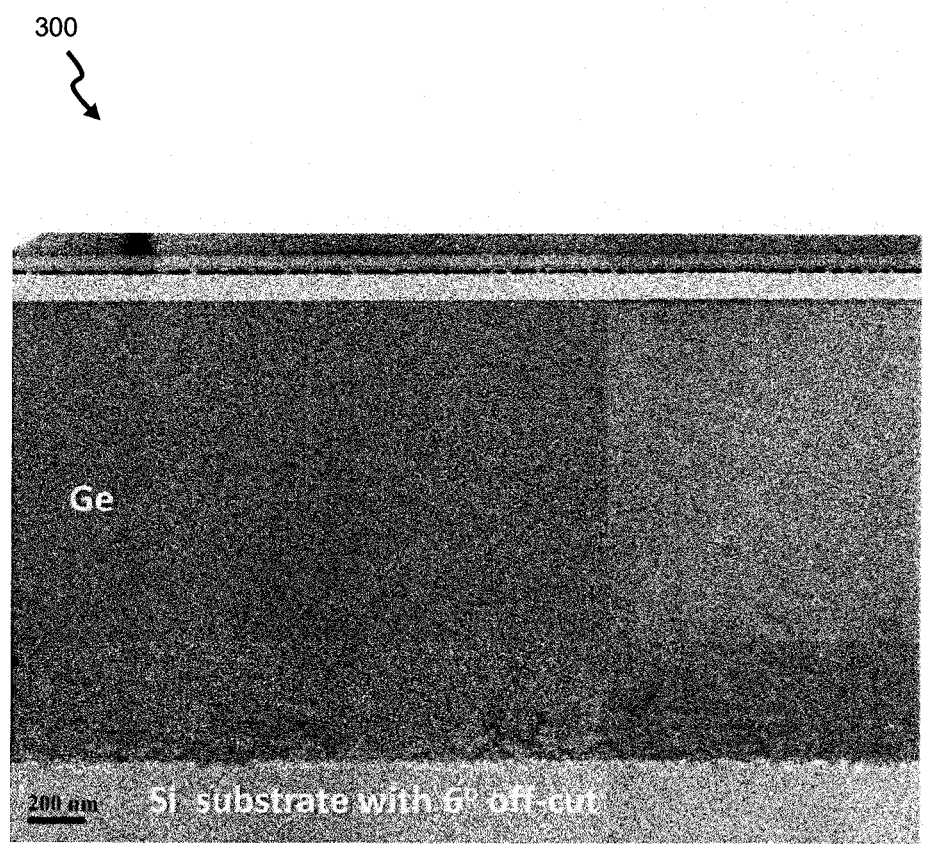
FIG. 3 is a cross-sectional transmission electron microscopy (X-TEM) bright field image of a sample of the substrate of FIG. 1.

The cross-sectional transmission electron microscopy (X-TEM) bright field image 300 in FIG. 3 (of the Ge epitaxial film) shows that the Ge epitaxial layers have formed as expected. The thickness of entire Ge epitaxial film, as formed, is determined to be about 1.5 µm. As shown in the X-TEM image 300, the misfit dislocations are largely confined along the Ge/Si re-growth interface. Additionally, most of the threading dislocations (TD) are confined within the first 700 nm Ge layer (above the Ge/Si interface), where the Ge epilayer is doped with As at the steps (i) and (ii). Beyond this thickness, no visible TD is observed under the X-TEM, indicating that the surface of the Ge film has lesser than $10^8$ threading dislocations per $cm^2$ obtained during the high temperature pure Ge growth, and is of a fairly high quality.

Figures 4A, 4B:
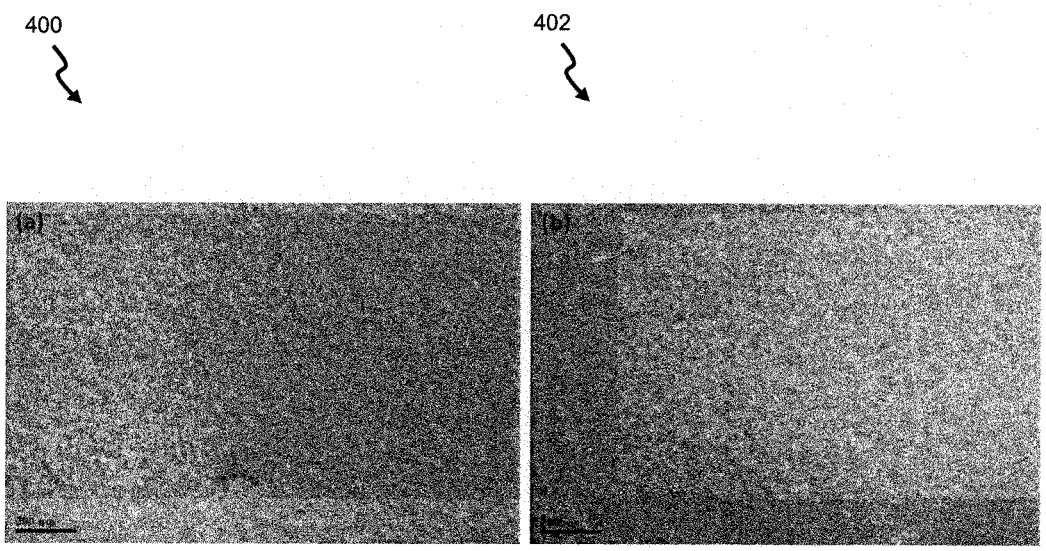
FIG. 4a is a plan view TEM image showing threading dislocations on the Ge surface of the sample of the substrate of FIG. 1, where one treading dislocation is observed on the area.
FIG. 4b is a plan view TEM image showing threading dislocations on the Ge surface of the sample of the substrate of FIG. 1, where no threading dislocation is observed.

The threading dislocations density (TDD) can be more accurately determined from the plan-view TEM (of the Ge epitaxial film) by estimating the dislocations in a given area at a number of locations across the entire the Ge epitaxial film, as shown in respective images 400, 402 in FIGS. 4a and 4b. More specifically, only one threading dislocation is found in FIG. 4a, while no threading dislocation can be located in most of the areas in FIG. 4b. Overall, the TDD determined from FIG. 4a is estimated to be about $1.06 \pm 0.64 \times 10^7/cm^2$. For completeness, it is to be appreciated that due to the limitation of the TEM, obtaining an image with a smaller magnification is not possible. Hence, the above estimated TDD value represents an upper-bound value, and is likely overestimated.

Figures 5A, 5B:
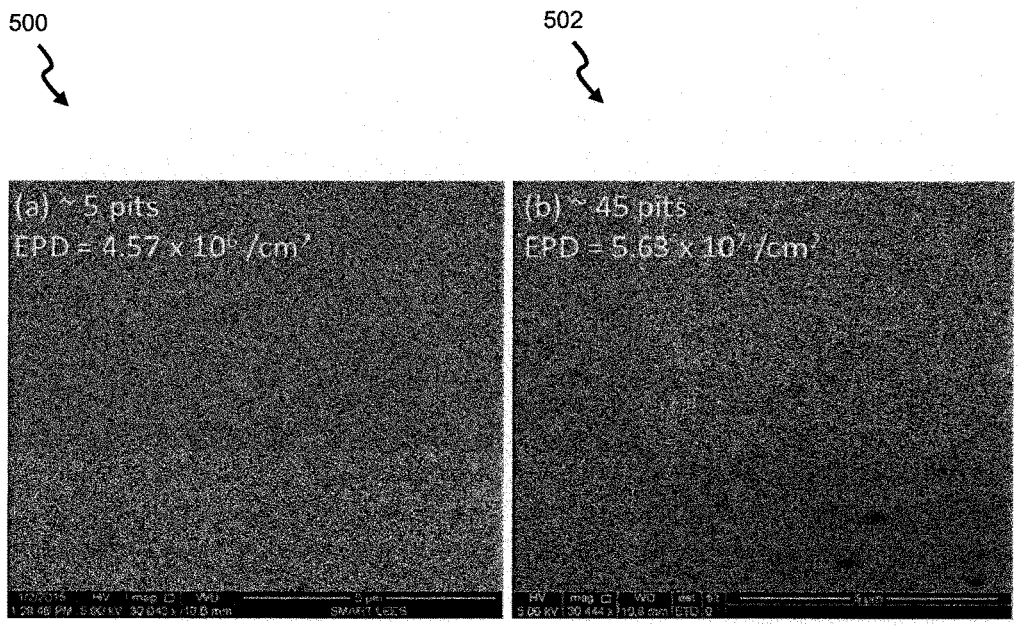
FIGS. 5a and 5b are respectively field emission scanning electron microscopy (FESEM) images taken to determine the etch pit density (EPD) of the Ge epilayer on a Si substrate with 6° off-cut, where a heavily As-doped Ge seed layer is used in the case of FIG. 5a, whereas an un-doped Ge seed layer is used in the case of FIG. 5b.

To quantify the TDD (of the Ge epitaxial film) via lower magnification images, a field emission scanning electron microscope (FESEM) is utilised with etch-pitting techniques. The Ge epitaxial film is initially etched in an iodine solution for about one second. Since the dislocations are etched much faster in the etchant, an etch pit can consequently be delineated and observed. The etch pit density (EPD) value is estimated, based on an average number of twenty plan-view FESEM images for better accuracy. The estimated EPD of the Ge epitaxial film formed with the As-doped Ge seed layer is about $4.57 \pm 0.39 \times 10^6/cm^2$, as shown in image 500 in FIG. 5a. This is much lower as compared to the control sample (i.e. direct Ge grown on Si with 6° off-cut substrate, but without including As-doping) which is determined to have an EPD of around $5.63 \pm 0.63 \times 10^7/cm^2$—see image 502 in FIG. 5b. Thus, by using the method 200 to manufacture the Ge epitaxial film, the resulting EPD is beneficially reduced by at least one-order of magnitude.

As reported in literature, the velocity of dislocation is enhanced when the Ge bulk crystal is As-doped. This is due to presence of shallow donor or acceptor levels at the dislocation or other defects, such as kinks or anti-phase defects. The dislocation itself is thought to contain reconstructed bonds only, while there may be dangling bonds at its defects. These shallow levels could change to deep levels while the kink pair/kink reaches its saddle point of formation/movement, respectively. The saddle point structure has a highest occupied level displaced to about mid-gap. The difference in energy between these levels is spent for kink pair formation/kink migration, and so consequently lowers the activation energy of the dislocation. Hence, the n-type doped Ge is experiencing an enhancement in dislocation motion. Similar explanation is applicable in this case, as observed in the present embodiment. Since the velocity of the dislocations of the (As-doped) Ge epitaxial film is improved, there is accordingly a higher probability that the dislocations Burgers vector with the opposite sign meet more readily and annihilate during the thermal cyclic annealing process. Hence, the TDD is reduced to a greater degree than the case with no doping and lower dislocation velocity.

Figure 6:
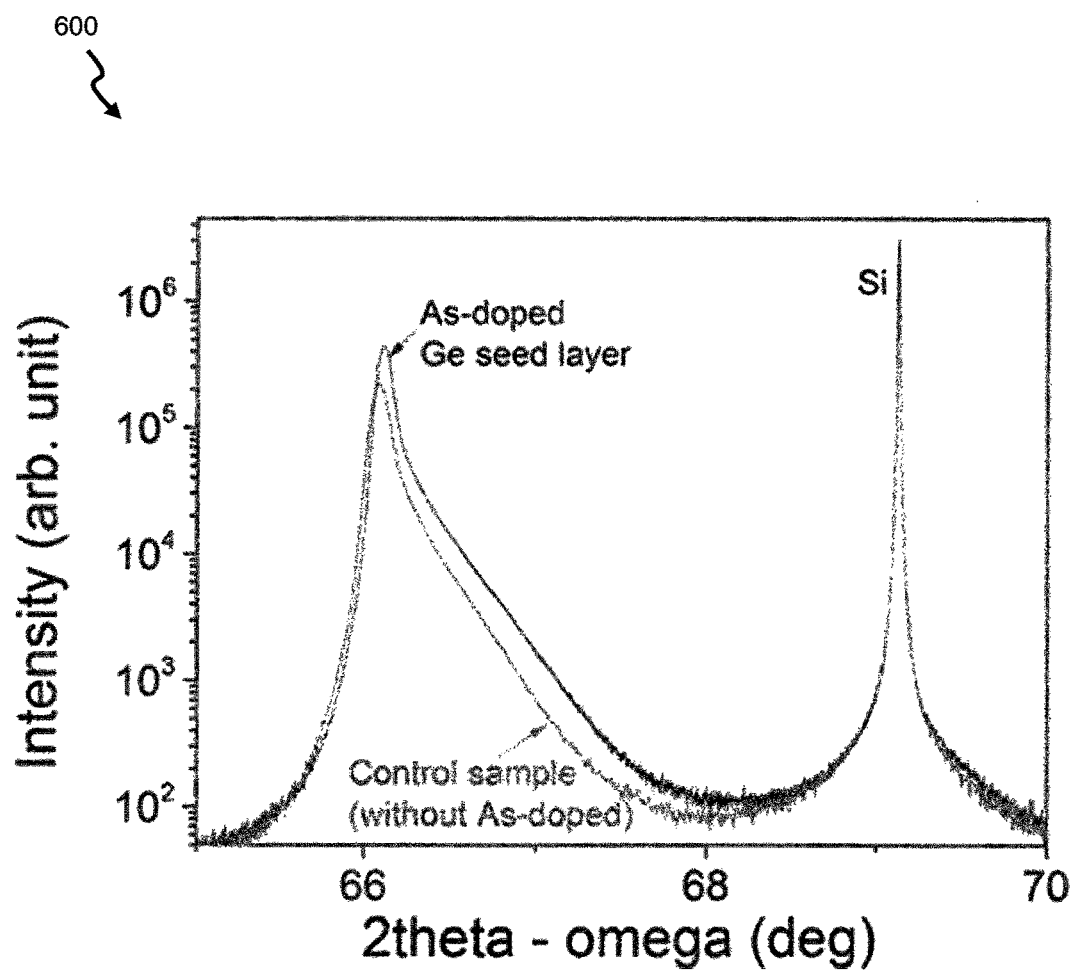
FIG. 6 is an image of a high resolution x-ray diffraction (HRXRD) profile taken to illustrate the crystallinity and the strain state of the Ge epitaxial film.

Since the strain state of the Ge epilayer (i.e. the third layer 108) affects the electrical and optical properties of the Ge epitaxial film, a HRXRD study is performed to estimate the strain level of the Ge epilayer. FIG. 6 depicts an image 600 of the HRXRD measurement profile taken on the Ge epitaxial film. The strain level of the Ge epilayer can be estimated using methods known in literature, and not elaborated herein for brevity. It is determined that the Ge epilayer, in the cases of with and without having the As-doped Ge seed layer, has a tensile strain of 0.21% and 0.16% respectively. The tensile strain is thermally induced in the Ge epilayer during cooling from high temperature processing steps to room temperature, as Ge has linear coefficient of thermal expansion (CTE) of 5.8 ppm/° C. compare to Si of 2.6 ppm/° C. From FIG. 6, it may be seen that the position of Ge peak with As-doped is slightly shifted to the right side with reference to the control sample, indicating that the Ge with As-doping has slightly higher tensile strain. Further, the full width half maximum (FWHM) value of the Ge peak with As-doping is about 171 arcsec, which is smaller than the control sample's 211 arcsec. The corresponding decrease in the FWHM value, and increase in intensity of the Ge peak indicate that the Ge epilayer with the As-doped Ge seed layer provides a better crystallinity as a better crystal has more reflective planes.

It is further to be appreciated that both the Ge peaks are asymmetric and show a clear shoulder at the side towards higher incidence angles. This is due to Ge/Si intermixing at the interface during thermal processing that perturbs the abrupt interface, which results in an intermediate $Si_{1-x}Ge_x$ layer. The Ge epilayer with As-doped Ge seed layer has a broader shoulder compared to the control sample, which indicates that the composition of $Si_{1-x}Ge_x$ changes more gradually (in the case of being As-doped) instead of suffering an abrupt change (in the case of un-doped Ge seed layer). This behaviour may beneficially contribute to TDD reduction of the Ge epitaxial film formed using the proposed method 200. Particularly, Si—Ge inter-diffusivity is enhanced by 10-20 times when Ge is highly doped with phosphorus (P) due to much faster P transport towards the Ge seeding layer, which thus increases Si—Ge inter-diffusion due to the Fermi level effect. Therefore, this suggests that heavy levels of As-doping may also increase inter-diffusion by the same exact mechanism.

Figure 7:
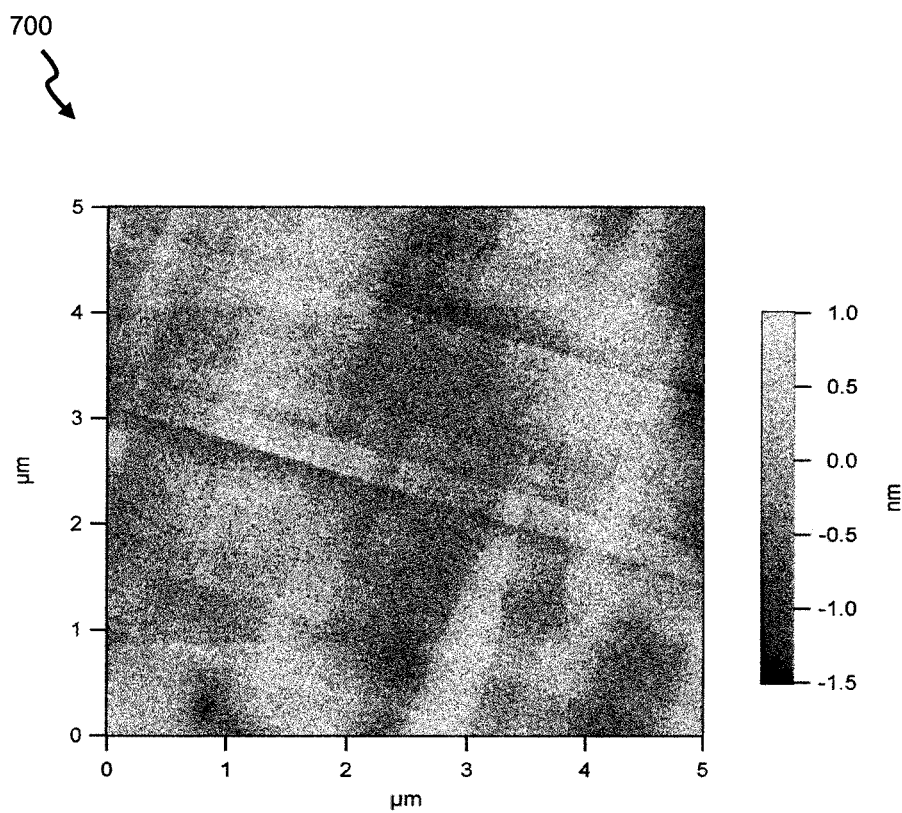
FIG. 7 is an image of two dimensional (2-D) AFM scans (of dimension: 5 μm by 5 μm) showing the RMS roughness of an as-grown Ge epilayer with an As-doped seed layer, manufactured using the method of FIG. 2.

The RMS surface roughness of the Ge epitaxial film is less than 0.50 nm (e.g. in this instance, 0.37 nm to be specific) as estimated from a two-dimensional AFM image 700 (of dimension: 5 μm by 5 μm) shown in FIG. 7. As a comparison, if the Ge epilayer is grown using the un-doped Ge seed layer, the RMS roughness is 2 nm. In addition, a clear crosshatch pattern is seen on the 6° off-cut sample (of the Ge epitaxial film). The smooth surface is a result of dislocation motion occurring after completion of epitaxial growth. The As dopants may also have helped to promote migration of the Ge atoms during the high temperature annealing, which further improves the smoothness of Ge epilayer.

Figure 8:
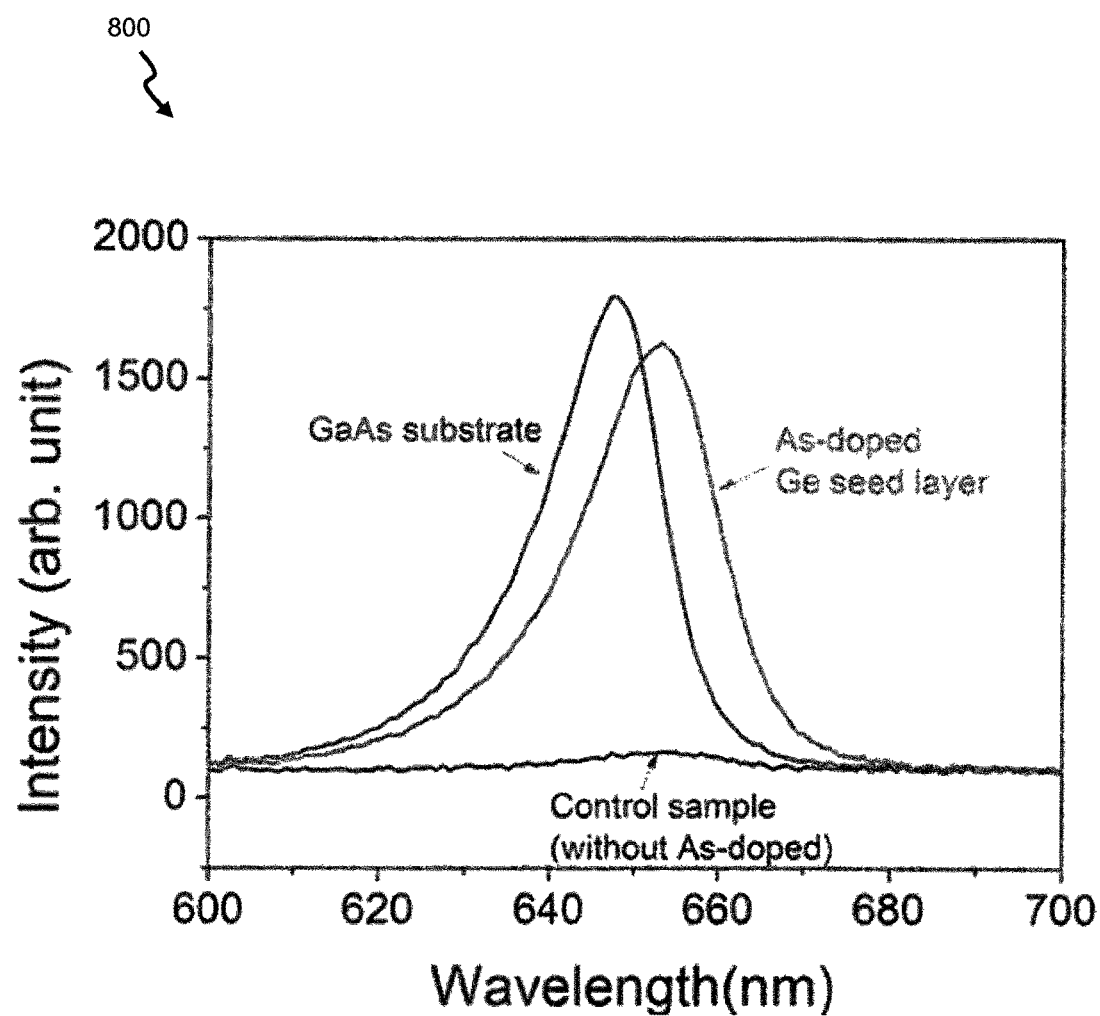
FIG. 8 is an image of photoluminescence (PL) of a red InGaP LED structure that is grown on Ge/Si with and without As doped Ge seed layer and GaAs substrate, where it is observed that the PL intensity of the Ge/Si with As-doped Ge seed layer is comparable to the GaAs substrate.

Another way to determine the quality of the Ge epilayer is through the intensity of photoluminescence (PL) emitted from a light emitting diode (LED) structure that is grown on the Ge/Si substrate. As the electrical efficiency of an optoelectronic device mainly depends on the lifetime of minority carriers, a higher TDD will reduce the lifetime of the minority carrier, thus leading to lower efficiency. For comparison, a red InGaP LED structure is grown on the GaAs bulk substrate (n-type with Si doping of $1-4 \times 10^{18}/cm^3$), Ge epilayer with and without As-doped Ge seed layer under the same batch of growth. As shown in image 800 of FIG. 8, the PL intensity of the red InGaP LED grown on the Ge epilayer, configured with As-doping, is comparable to that of the GaAs substrate. On the other hand, the PL intensity is the lowest for the control sample. The shift of PL peak location between the GaAs substrate and Ge epilayer with As-doped Ge seed layer is due to the strain of the starting materials. For the GaAs substrate, it is a strain-free material, whereas the Ge epilayer with As-doping is instead determined to have a tensile strain of around 0.2%.

3. Conclusion

In summary, the EPD of Ge epitaxial films grown on Si substrates with 6° off-cut (using the proposed method 200) is reduced by at least one order of magnitude to less than $5 \times 10^6/cm^2$ using a Ge seed layer with As-doping. The FWHM value of the Ge peak found in the HRXRD study is also reduced by about 20%. In addition, the determined RMS roughness of 0.37 nm is one of the lowest reported values in literature. Furthermore, the high quality of Ge epilayer has also been verified as it can be used for growing a red InGaP LED structure having a PL intensity comparable to the GaAs substrate.

Advantageously, the proposed method 200 thus enables manufacturing the substrate 100 with reduced threading dislocation density, being around $4.5 \times 10^6$ cm$^{-2}$, which is one order of magnitude lower than conventional techniques for growing Ge film on Si substrates. The disclosed method 200 is also scalable to manufacture any wafer size, hence making the method 200 manufacturing worthy. Moreover, the TDD reduction is achieved by manufacturing the substrate 100 using a fully in-situ process within a MOCVD reactor, which beneficially leads to better process control, since it reduces the need for handling and thereby raises fewer concerns relating to cleanliness and tool cross-contamination issues.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention. For example, an optional thin layer (not shown in FIG. 1) may also be deposited on the semiconductor substrate 102, prior to forming the first layer 104 on the semiconductor substrate 102. The thin layer may be of a thickness not exceeding 100 nm. It is also to be appreciated that the annealing performed using hydrogen can also be done at a temperature that is between room temperature to a temperature close to germanium's melting point, i.e. at a temperature between 25° C. to 940° C. Then, the first concentration of the dopant used may be selected to be at a level between approximately $8 \times 10^{18}/cm^3$ to $1 \times 10^{20}/cm^3$, depending on circumstances. Also, to clarify, multiple dopants (if necessary) may also be used to dope the first layer 104, and/or second layer 106, and the multiple dopants used need not all belong to a same chemical group in the periodic table, so long they are suitable for the doping application intended.

Figure 10:
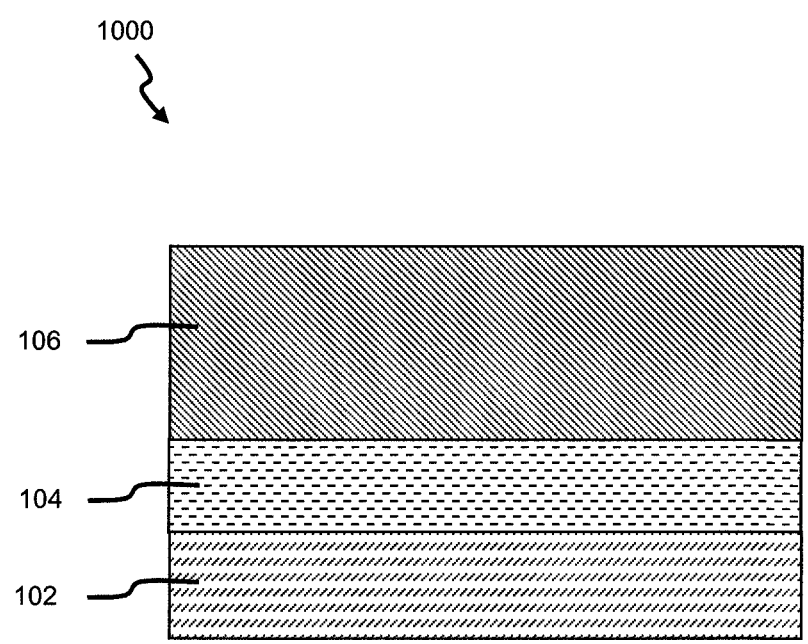
FIG. 10 is a schematic cross-sectional view of a substrate with reduced threading dislocation density, according to a further embodiment.

Yet further, there is another possible variant embodiment to the method 200 of FIG. 2, where step 206 is omitted in this case, i.e. step 206 is optional. Accordingly, the second concentration of the doping for the second layer 106 can flexibly be arranged to be of a suitable value, as already afore described, which advantageously allows omission of step 206. For example, the second concentration of the doping may be configured to be of substantially zero concentration, so that a portion of the second layer 106 doped at zero concentration effectively becomes the third layer 108 of FIG. 1, without need to actually carry out step 206. So the portion of the second layer 106 formed with zero doping can be construed to be the third layer 108 of FIG. 1. Moreover, the portion of the second layer 106 doped at the second concentration can be formed thicker, if necessary. Therefore, with reference to FIG. 10, a corresponding substrate 1000 (manufactured using the variant method) comprises: the semiconductor substrate 102; the first layer 104 of the wafer material formed on the semiconductor substrate 102, the first layer 104 being doped with the first concentration of the (at least one) dopant; and the second layer 106 of the wafer material formed on the first layer 104 to obtain the substrate 1000, the second layer 106 being doped with a progressively decreasing concentration of the dopant, in which the doping is progressively decreased from the first concentration to the second concentration.

The invention claimed is:

1. A substrate with reduced threading dislocation density, comprising:
   a semiconductor substrate;
   a first germanium layer formed on the semiconductor substrate, the first germanium layer being doped with a first concentration of at least one dopant that is of a different material to the first germanium layer; and
   a second germanium layer formed on the first germanium layer, the second germanium layer being doped with a second concentration of the at least one dopant, doped concentration of the at least one dopant in the second germanium layer being decreased progressively from the first concentration to the second concentration, wherein the dopant is different to silicon.

2. The substrate of claim 1, wherein the first and second germanium layers are collectively configured with a thickness of about 1.5 µm, and have an etch-pit density of less than 5×106/cm2.

3. The substrate of claim 2, wherein the substrate has an RMS surface roughness of less than 0.50 nm.

4. The substrate of claim 1, wherein the at least one dopant includes a group V semiconductor material.

5. The substrate of claim 4, wherein the group V semiconductor material includes arsenic, or phosphorus.

6. The substrate of claim 1, wherein the semiconductor substrate is a silicon substrate with 6° off-cut toward [110] direction.

7. The substrate of claim 1, wherein the first concentration is between approximately 8×1018/cm3 to 1×1020/cm3.

8. The substrate of claim 1, wherein the second concentration of the at least one dopant is substantially zero.

* * * * *